US012782472B2

(12) United States Patent
Kojima et al.

(10) Patent No.: US 12,782,472 B2
(45) Date of Patent: Nov. 3, 2026

(54) MAGNETIC SENSOR INCLUDING A MAGNETIC DETECTION ELEMENT DISPOSED ON AN ELECTRODE

(71) Applicant: TDK Corporation, Tokyo (JP)

(72) Inventors: Hidekazu Kojima, Tokyo (JP); Hiromichi Umehara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 120 days.

(21) Appl. No.: 19/026,827

(22) Filed: Jan. 17, 2025

(65) Prior Publication Data

US 2025/0155531 A1 May 15, 2025

Related U.S. Application Data

(63) Continuation of application No. 18/524,172, filed on Nov. 30, 2023, now Pat. No. 12,235,333, which is a (Continued)

(30) Foreign Application Priority Data

Sep. 1, 2022 (JP) ................................ 2022-139170

(51) Int. Cl.
*G01R 33/09* (2006.01)
*G01R 33/00* (2006.01)

(52) U.S. Cl.
CPC ....... *G01R 33/093* (2013.01); *G01R 33/0005* (2013.01); *G01R 33/098* (2013.01)

(58) Field of Classification Search
CPC ......................... G01R 33/093; G01R 33/0005; G01R 33/098; G01R 33/0017; G01R 33/0052;

(Continued)

(56) References Cited

U.S. PATENT DOCUMENTS 6,327,107 B1 12/2001 Komuro
6,794,697 B1 9/2004 Sharma (Continued)

FOREIGN PATENT DOCUMENTS

DE 102020130454 A1 5/2021
JP 11-316919 A 11/1999

(Continued)

OTHER PUBLICATIONS

Translation of Jan. 27, 2026 Office Action issued in Japanese Application No. 2022-139173.

(Continued)

*Primary Examiner* — Alvaro E Fortich
(74) *Attorney, Agent, or Firm* — Oliff PLC

(57) ABSTRACT

A magnetic sensor includes a substrate including a top surface; an insulating layer disposed on the substrate, the insulating layer including first and second inclined surfaces each inclined with respect to the top surface of the substrate; and an MR element structure. An MR element is disposed on the first inclined surface or the second inclined surface. The MR element includes a bottom surface facing the first inclined surface or the second inclined surface, a top surface, and a first surface connecting the bottom surface and the top surface and including two steps.

18 Claims, 13 Drawing Sheets

Related U.S. Application Data continuation of application No. 17/947,735, filed on Sep. 19, 2022, now Pat. No. 11,874,346.

(60) Provisional application No. 63/246,428, filed on Sep. 21, 2021.

(58) Field of Classification Search
CPC . G01R 33/0206; G01R 33/091; G01R 33/095
See application file for complete search history.

(56) References Cited

U.S. PATENT DOCUMENTS

| | | | | |
|---|---|---|---|---|
| 11,874,346 | B2 * | 1/2024 | Kojima | G01R 33/093 |
| 2002/0006020 | A1 | 1/2002 | Hasegawa | |
| 2006/0176142 | A1 * | 8/2006 | Naito | G01R 33/0206<br>257/E27.005 |
| 2006/0261425 | A1 | 11/2006 | Suemitsu | |
| 2008/0316654 | A1 | 12/2008 | Aiso | |
| 2009/0015251 | A1 | 1/2009 | Azumi et al. | |
| 2009/0268349 | A1 * | 10/2009 | Makino | G11B 5/1278<br>360/314 |
| 2009/0273863 | A1 * | 11/2009 | Kawano | G11B 5/3163<br>156/60 |
| 2010/0102406 | A1 | 4/2010 | Xi et al. | |
| 2012/0272514 | A1 * | 11/2012 | Naito | B82Y 25/00<br>29/602.1 |
| 2018/0292472 | A1 | 10/2018 | Makino et al. | |
| 2021/0156933 | A1 | 5/2021 | Makino | |
| 2021/0302511 | A1 * | 9/2021 | Makino | G01R 33/0047 |

FOREIGN PATENT DOCUMENTS

| | | | |
|---|---|---|---|
| JP | 2001-56908 | A | 2/2001 |
| JP | 2002-33532 | A | 1/2002 |
| JP | 2003-110163 | A | 4/2003 |
| JP | 2004-128229 | A | 4/2004 |
| JP | 2005-109493 | A | 4/2005 |
| JP | 2012-533188 | A | 12/2012 |
| JP | 2018-181996 | A | 11/2018 |
| JP | 2021-85738 | A | 6/2021 |

OTHER PUBLICATIONS

Aug. 1, 2024 Office Action Issued in U.S. Appl. No. 18/524,172.

Translation of Jun. 20, 2024 Office Action issued in German Application No. 102022124054.1.

Translation of Dec. 9, 2025 Office Action issued in Japanese Patent Application No. 2022-139170.

* cited by examiner

MAGNETIC SENSOR INCLUDING A MAGNETIC DETECTION ELEMENT DISPOSED ON AN ELECTRODE

CROSS REFERENCE TO RELATED APPLICATIONS

This application is a continuation application of U.S. patent application Ser. No. 18/524,172, filed on Nov. 30, 2023, which is a continuation of U.S. application Ser. No. 17/947,735, filed Sep. 19, 2022, which claims the benefit of U.S. Provisional Patent Application No. 63/246,428 filed on Sep. 21, 2021 and Japanese Priority Patent Application No. 2022-139170 filed on Sep. 1, 2022, the entire contents of each of which are incorporated herein by their reference.

BACKGROUND

The technology relates to a magnetic sensor including magnetoresistive elements each disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

U.S. Patent Application Publication No. 2006/0176142 A1 and U.S. Patent Application Publication No. 2008/0316654 A1 each disclose a magnetic sensor including magnetoresistive elements each disposed on an inclined surface. In the magnetic sensor disclosed in U.S. Patent Application Publication No. 2008/0316654 A1, side surfaces of each magnetoresistive element are forward-tapered with respect to the inclined surface.

As the magnetoresistive elements, TMR (tunneling magnetoresistive) elements or GMR (giant magnetoresistive) elements are used, for example. In the TMR element, a current is made to flow in a direction almost perpendicular to a surface of each layer forming the TMR element. As the GMR element, a CPP (Current Perpendicular to Plane) GMR element is known in which a current is made to flow in a direction almost perpendicular to a surface of each layer forming the GMR element. In a case where TMR elements or CPP GMR elements are used as the magnetoresistive elements, the plurality of magnetoresistive elements are connected in series by a plurality of lower electrodes and a plurality of upper electrode.

As described above, in TMR elements or CPP GMR elements, the magnetoresistive elements are disposed between lower electrodes and upper electrodes. Since the thickness of each magnetoresistive element is relatively small, the gap between each lower electrode and each upper electrode is also relatively small. Thus, there is a possibility that the lower electrode and the upper electrode may become shorted. Such a problem is prominent when each magnetoresistive element is disposed on an inclined surface.

SUMMARY

A magnetic sensor according to one embodiment of the technology includes a substrate including a reference plane; a support member disposed on the substrate, the support member including an inclined surface inclined with respect to the reference plane; and a magnetic detection element structure disposed on the inclined surface, the magnetic detection element structure including a bottom surface facing the inclined surface, a top surface on a side opposite to the bottom surface, and a first surface connecting the bottom surface and the top surface and including two steps.

In the magnetic sensor according to one embodiment of the technology, the magnetic detection element structure includes the bottom surface, the top surface, and the first surface connecting the bottom surface and the top surface and including two steps. Thereby, according to one embodiment of the technology, it is possible to prevent a short between electrodes, in a magnetic sensor including magnetoresistive elements each disposed on an inclined surface.

Other and further objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
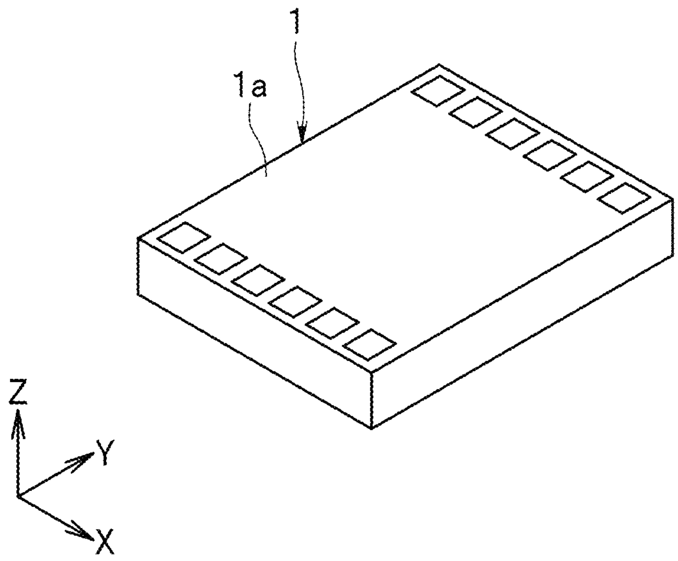
FIG. 1 is a perspective view showing a magnetic sensor according to a first example embodiment of the technology.

An object of the technology is to provide a magnetic sensor that includes magnetoresistive elements each disposed on an inclined surface and in which a short between electrodes can be prevented.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
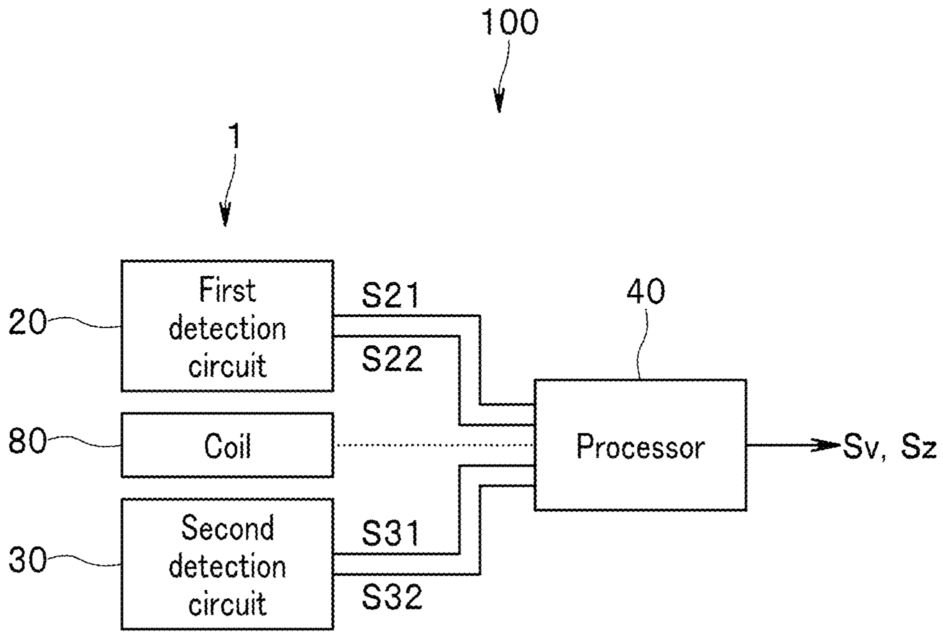
FIG. 2 is a functional block diagram showing a configuration of a magnetic sensor device including the magnetic sensor according to the first example embodiment of the technology.

First, a configuration of a magnetic sensor according to a first example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment.

As shown in FIG. 1, the magnetic sensor 1 is in the form of a chip having a rectangular parallelepiped shape. The magnetic sensor 1 includes a top surface 1*a* and a bottom surface located opposite to each other and also includes four side surfaces connecting the top surface 1*a* to the bottom surface. The magnetic sensor 1 also includes a plurality of electrode pads disposed on the top surface 1*a*.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1*a* of the magnetic sensor 1 and is oriented from the bottom surface to the top surface 1*a* of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that an object is seen from a position at a distance in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1*a* of the magnetic sensor 1, the magnetic sensor 1 may be mounted on the top surface of the support in such a posture that the bottom surface of the magnetic sensor 1 faces the top surface of the support.

Figure 3:
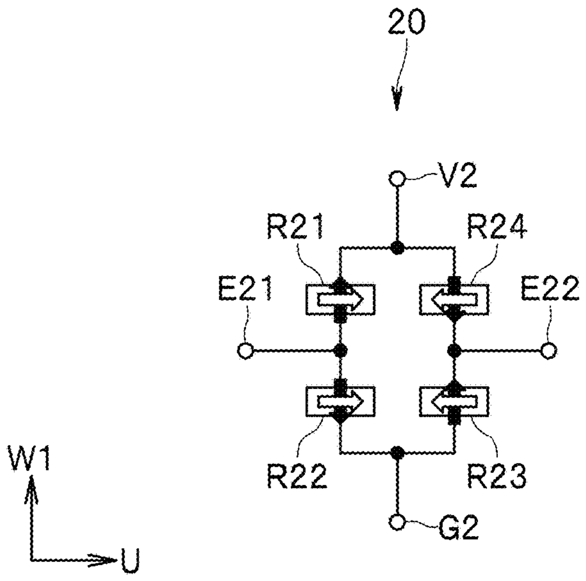
FIG. 3 is a circuit diagram showing a circuit configuration of a first detection circuit of the first example embodiment of the technology.
Figure 4:
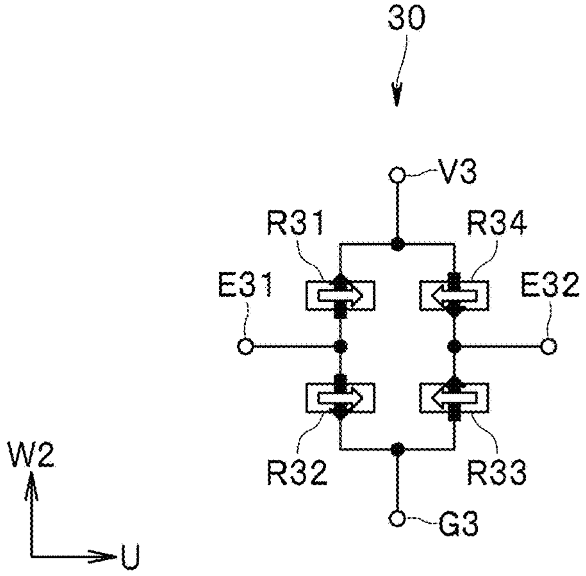
FIG. 4 is a circuit diagram showing a circuit configuration of a second detection circuit of the first example embodiment of the technology.
Figure 5:
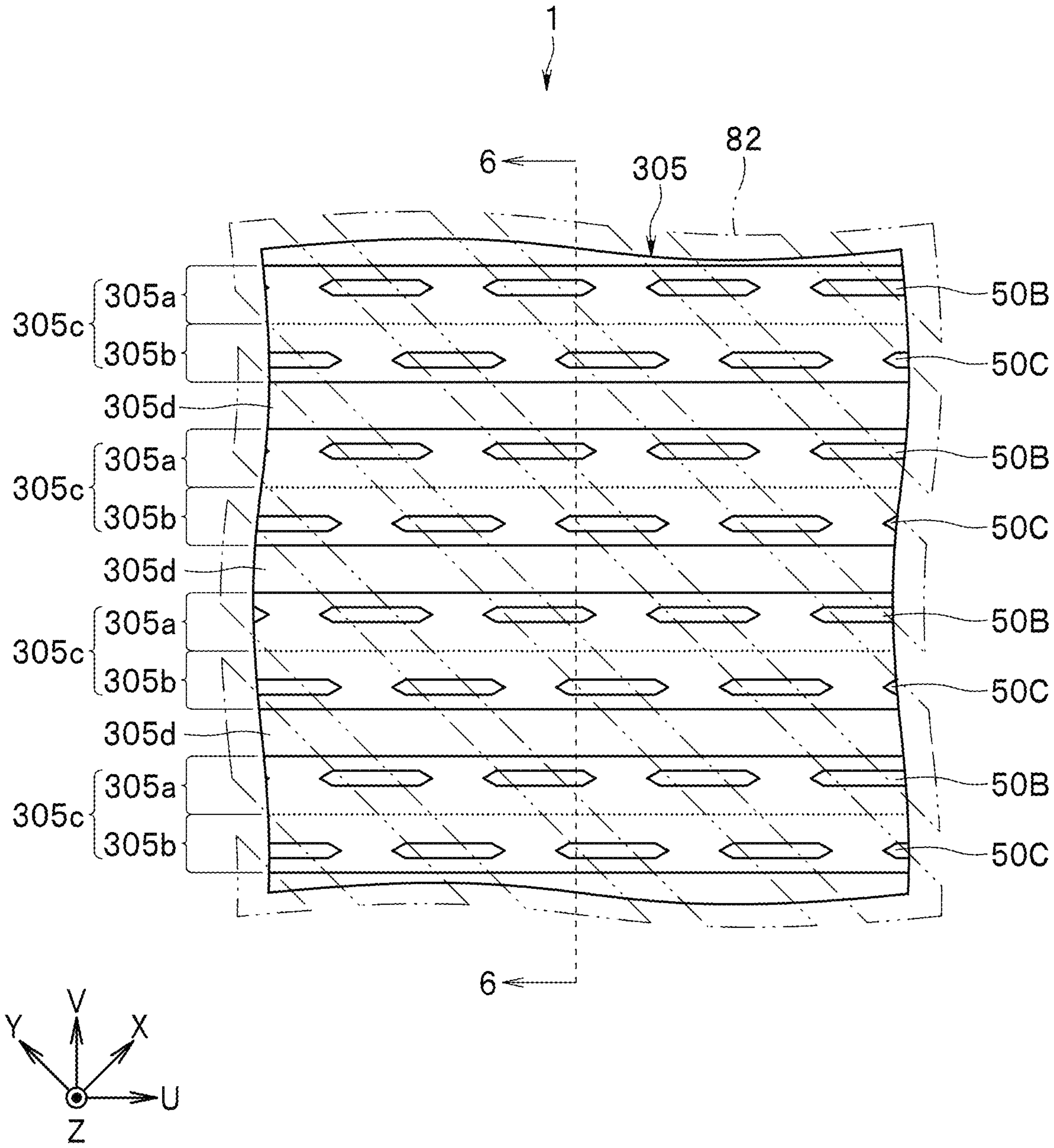
FIG. 5 is a plan view showing a part of the magnetic sensor according to the first example embodiment of the technology.
Figure 6:
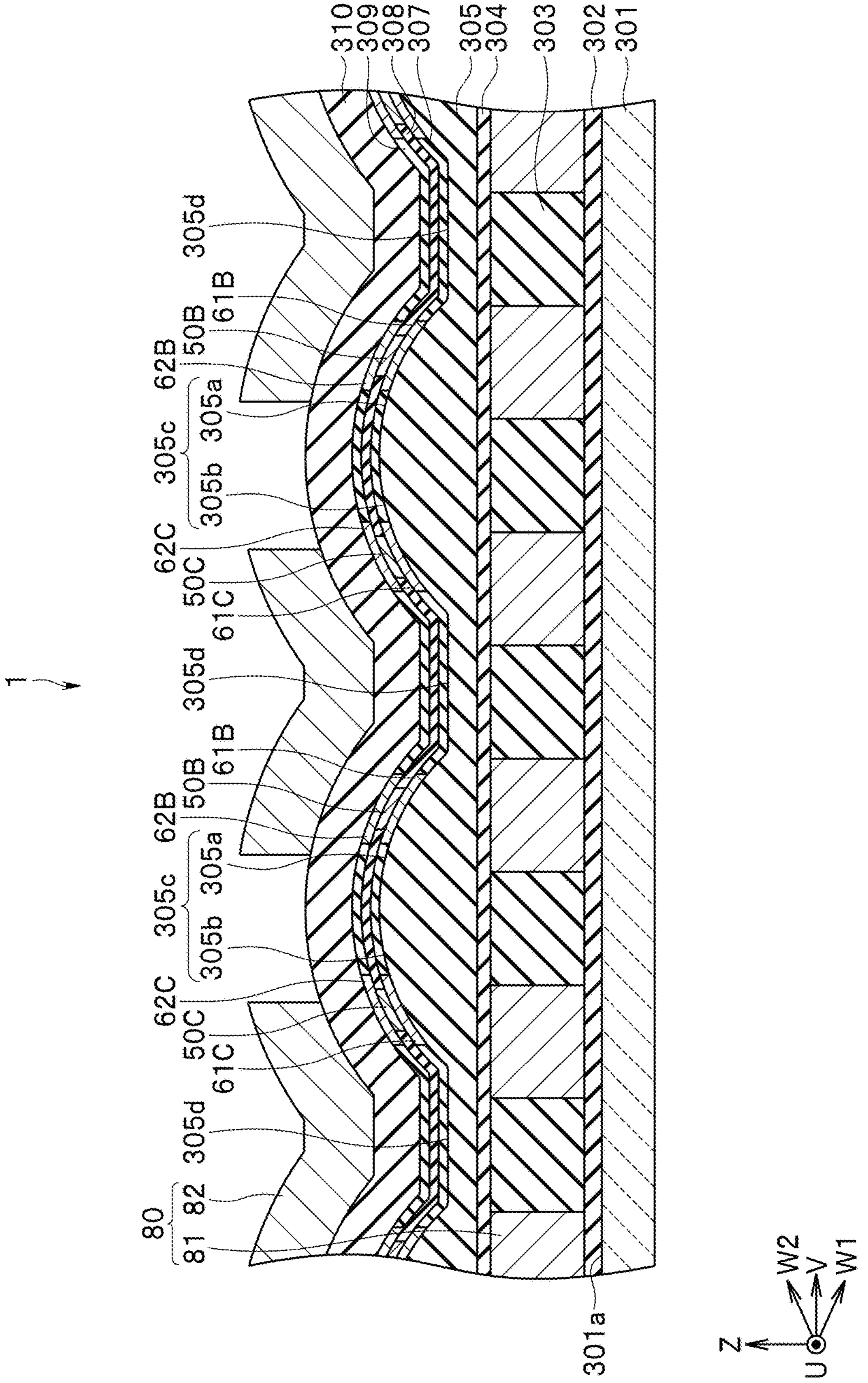
FIG. 6 is a sectional view showing a part of the magnetic sensor according to the first example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by $\alpha$, and the V direction is set to a direction rotated from the Y direction to the X direction by $\alpha$. Note that $\alpha$ is an angle greater than 0° and smaller than 90°. For example, α is 45°. −U direction refers to a direction opposite to the U direction, and −V direction refers to a direction opposite to the V direction.

As shown in FIG. 6, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
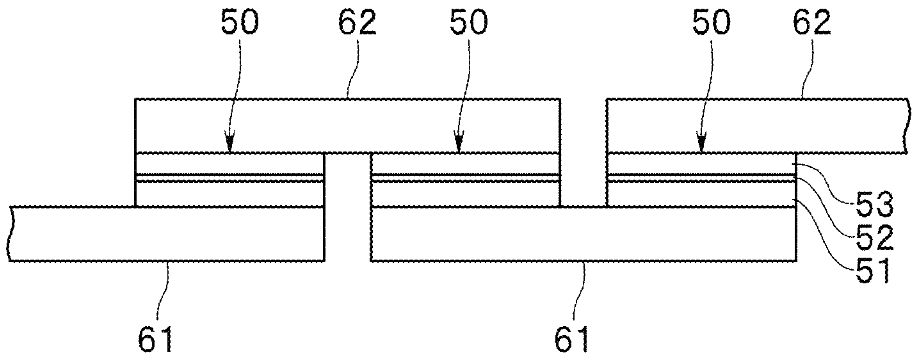
FIG. 7 is a side view showing a magnetoresistive element of the first example embodiment of the technology.

FIG. 7 is a side view showing the MR element 50. The MR element 50 is a spin-valve MR element including a plurality of magnetic layers. The MR element 50 includes a magnetization pinned layer 51 having a magnetization whose direction is fixed, a free layer 53 having a magnetization whose direction is variable depending on the direction of a target magnetic field, and a gap layer 52 located between the magnetization pinned layer 51 and the free layer 53. The MR element 50 may be a tunneling magnetoresistive (TMR) element or a giant magnetoresistive (GMR) element. In the TMR element, the gap layer 52 is a tunnel barrier layer. In the GMR element, the gap layer 52 is a nonmagnetic conductive layer. The resistance of the MR element 50 changes with the angle that the magnetization direction of the free layer 53 forms with respect to the magnetization direction of the magnetization pinned layer 51. The resistance of the MR element 50 is at its minimum value when the foregoing angle is 0°, and at its maximum value when the foregoing angle is 180°. In each MR element 50, the free layer 53 has a shape anisotropy that sets the direction of the magnetization easy axis to be orthogonal to the magnetization direction of the magnetization pinned layer 51. As a method for setting the magnetization easy axis in a predetermined direction in the free layer 53, a magnet configured to apply a bias magnetic field to the free layer 53 can be used. The magnetization pinned layer 51, the gap layer 52, and the free layer 53 are stacked in this order.

The MR element 50 may further include an antiferromagnetic layer disposed on the magnetization pinned layer 51 on the side opposite to the gap layer 52. The antiferromagnetic layer is formed of an antiferromagnetic material, and is in exchange coupling with the magnetization pinned layer 51 to thereby pin the magnetization direction of the magnetization pinned layer 51. Alternatively, the magnetization pinned layer 51 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled.

It should be appreciated that the layers 51 to 53 of each MR element 50 may be stacked in the reverse order to that shown in FIG. 7.

In FIGS. 3 and 4, solid arrows represent the magnetization directions of the magnetization pinned layers 51 of the MR elements 50. Hollow arrows represent the magnetization directions of the free layers 53 of the MR elements 50 in a case where no target magnetic field is applied to the MR elements 50.

In the example shown in FIG. 3, the magnetization directions of the magnetization pinned layers 51 in each of the first and third resistor sections R21 and R23 are the W1 direction. The magnetization directions of the magnetization pinned layers 51 in each of the second and fourth resistor sections R22 and R24 are the −W1 direction. The free layer 53 in each of the plurality of first MR elements 50B has a shape anisotropy that sets the direction of the magnetization easy axis to a direction parallel to the U direction. The magnetization directions of the free layers 53 in each of the first and second resistor sections R21 and R22 in a case where no target magnetic field is applied to the first MR elements 50B are the U direction. The magnetization directions of the free layers 53 in each of the third and fourth resistor sections R23 and R24 in the foregoing case are the −U direction.

In the example shown in FIG. 4, the magnetization directions of the magnetization pinned layers 51 in each of the first and third resistor sections R31 and R33 are the W2 direction. The magnetization directions of the magnetization pinned layers 51 in each of the second and fourth resistor sections R32 and R34 are the −W2 direction. The free layer 53 in each of the plurality of second MR elements 50C has a shape anisotropy that sets the direction of the magnetization easy axis to a direction parallel to the U direction. The magnetization directions of the free layers 53 in each of the first and second resistor sections R31 and R32 in a case where no target magnetic field is applied to the second MR elements 50C are the U direction. The magnetization directions of the free layers 53 in each of the third and fourth resistor sections R33 and R34 in the foregoing case are the −U direction.

The magnetic sensor 1 includes a magnetic field generator configured to apply a magnetic field in a predetermined direction to the free layer 53 of each of the plurality of first MR elements 50B, and the plurality of second MR elements 50C. In the present example embodiment, the magnetic field generator includes a coil 80 that applies a magnetic field in the predetermined direction to the free layer 53 in each of the plurality of first MR elements 50B and the plurality of second MR elements 50C.

Note that the magnetization directions of the magnetization pinned layers 51 and the directions of the magnetization easy axes of the free layers 53 may slightly deviate from the foregoing directions from the perspective of the accuracy of the manufacturing of the MR elements 50 and the like. The magnetization pinned layers 51 may be magnetized to include magnetization components in the foregoing directions as their main components. In such a case, the magnetization directions of the magnetization pinned layers 51 are the same or substantially the same as the foregoing directions.

In the present example embodiment, the MR element 50 is configured such that a current flows in the stacking direction of the plurality of magnetic layers, that is, the magnetization pinned layer 51 and the free layer 53. As described below, the magnetic sensor 1 includes a lower electrode and an upper electrode for flowing a current through the MR element 50. The MR element 50 is disposed between the lower electrode and the upper electrode.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301*a*, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301*a* of the substrate 301 is parallel to the XY plane. The Z direction is also a direction perpendicular to the top surface 301*a* of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304 and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and the plurality of lower electrodes 61C on the insulating layer 305. The plurality of first MR elements 50B are disposed on the plurality of lower electrodes 61B. The plurality of second MR elements 50C are disposed on the plurality of lower electrodes 61C. The insulating layer 308 is disposed around the plurality of first MR elements 50B and the plurality of second MR elements 50C on the plurality of lower electrodes 61B, the plurality of lower electrodes 61C, and the insulating layer 307. The plurality of upper electrodes 62B are disposed on the plurality of first MR elements 50B and the insulating layer 308. The plurality of upper electrodes 62C are disposed on the plurality of second MR elements 50C and the insulating layer 308. The insulating layer 309 is disposed around the plurality of upper electrodes 62B and the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The magnetic sensor 1 may further include a not-shown insulating layer that covers the plurality of upper coil elements 82 and the insulating layer 310.

The magnetic sensor 1 includes a support member supporting the plurality of first MR elements 50B and the plurality of second MR elements 50C. The support member includes at least one inclined surface inclined with respect to the top surface 301*a* of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305*c* each protruding in a direction (the Z direction) away from the top surface 301*a* of the substrate 301. Each of the plurality of protruding surfaces 305*c* extends in a direction parallel to the U direction. The overall shape of each of the protruding surfaces 305*c* is a semi-cylindrical curved surface formed by moving the curved shape (arch shape) of the protruding surface 305*c* shown in FIG. 6 along the direction parallel to the U direction. The plurality of protruding surfaces 305*c* are arranged at predetermined intervals along a direction parallel to the V direction.

Each of the plurality of protruding surfaces 305*c* includes an upper end portion farthest from the top surface 301*a* of the substrate 301. In the example embodiment, each of the upper end portions of the plurality of protruding surfaces 305*c* extends in the direction parallel to the U direction. Herein, focus is placed on a given protruding surface 305*c* of the plurality of protruding surfaces 305*c*. The protruding surface 305*c* includes a first inclined surface 305*a* and a second inclined surface 305*b*. The first inclined surface 305*a* refers to the part of the protruding surface 305*c* on the side of the V direction of the upper end portion of the protruding surface 305*c*. The second inclined surface 305*b* refers to the part of the protruding surface 305*c* on the side of the −V direction of the upper end portion of the protruding surface 305*c*. In FIG. 5, a boundary between the first inclined surface 305*a* and the second inclined surface 305*b* is indicated by a dotted line.

The upper end portion of the protruding surface 305*c* may be the boundary between the first inclined surface 305*a* and the second inclined surface 305*b*. In such a case, the dotted line shown in FIG. 5 indicates the upper end portion of the protruding surface 305*c*.

The top surface 301*a* of the substrate 301 is parallel to the XY plane. Each of the first inclined surface 305*a* and the second inclined surface 305*b* is inclined with respect to the top surface 301*a* of the substrate 301, that is, the XY plane. In a cross section perpendicular to the top surface 301*a* of the substrate 301, a distance between the first inclined surface 305*a* and the second inclined surface 305*b* becomes smaller in a direction away from the top surface 301*a* of the substrate 301.

In the example embodiment, since two or more protruding surface 305*c* are present, the number of each of the first inclined surfaces 305*a* and the second inclined surfaces 305*b* is also two or more. The insulating layer 305 includes the plurality of first inclined surfaces 305*a* and the plurality of second inclined surfaces 305*b*.

The insulating layer 305 further includes a flat surface 305*d* present around the plurality of protruding surfaces 305*c*. The flat surface 305*d* is a surface parallel to the top surface 301*a* of the substrate 301. Each of the plurality of protruding surfaces 305*c* protrudes in the Z direction from the flat surface 305*d*. In the example embodiment, the plurality of protruding surfaces 305*c* are disposed at predetermined intervals. Thus, the flat surface 305*d* is present between the two protruding surfaces 305*c* adjoining in the V direction.

The insulating layer 305 includes a plurality of protruding portions each protruding in the Z direction, and a flat portion present around the plurality of protruding portions. Each of the plurality of protruding portions extends in the direction parallel to the U direction and includes the protruding surface 305*c*. The plurality of protruding portions are arranged at predetermined intervals in the direction parallel to the V direction. The thickness (the dimension in the Z direction) of the flat portion is substantially constant. The insulating layer 304 has a substantially constant thickness (i.e., a dimension in the Z direction), and is formed along the bottom surface of the insulating layer 305.

The plurality of lower electrodes 61B are disposed on the plurality of first inclined surfaces 305*a*. The plurality of lower electrodes 61C are disposed on the plurality of second inclined surfaces 305*b*. As described above, since each of the first inclined surfaces 305*a* and the second inclined surfaces 305*b* is inclined with respect to the top surface 301*a* of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305*a* are curved surfaces. Therefore, the first MR elements 50B are curved along the curved surfaces (the first inclined surfaces 305*a*). For the sake of convenience, in the present example embodiment, the magnetization directions of the magnetization pinned layers 51 of the first MR elements 50B are defined as straight directions as described above. The W1 direction and the −W1 direction that are the magnetization directions of the magnetization pinned layers 51 of the first MR elements 50B are also directions in which the tangents to the first inclined surfaces 305*a* at the vicinity of the first MR elements 50B extend.

Similarly, in the example embodiment, the second inclined surfaces 305*b* are curved surfaces. Therefore, the second MR elements 50C are curved along the curved surfaces (the second inclined surfaces 305*b*). For the sake of convenience, in the present example embodiment, the magnetization directions of the magnetization pinned layers 51 of the second MR elements 50C are defined as straight directions as described above. The W2 direction and the −W2 direction that are the magnetization directions of the magnetization pinned layers 51 of the second MR elements 50C are also directions in which the tangents to the second inclined surfaces 305*b* at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305*a*. Similarly, the plurality of second MR elements 50C are disposed so that two or more MR elements 50C are arranged both in the U direction and in the V direction. The plurality of second MR elements 50C are aligned in a row on one second inclined surface 305*b*. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference numeral 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown electrode. The not-shown electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true also for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 53 in each of the plurality of first MR elements 50B and the plurality of second MR elements 50C. Alternatively, the coil 80 may be configured to be able to, for example, apply a magnetic field in the X direction to the free layers 53 in the first and second resistor sections R21 and R22 of the first detection circuit 20 and the first and second resistor sections R31 and R32 of the second detection circuit 30, and apply a magnetic field in the −X direction to the free layers 53 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sa and Sz as follows, for example. First, the processor 40 generates a value Sa by an arithmetic including obtainment of the difference S21−S22 between the first detection signal S21 and the first detection signal S22, and generates a value Sb by an arithmetic including obtainment of the difference S31−S32 between the second detection signal S31 and the second detection signal S32. Next, the processor 40 calculates values Sc and Sd using the following expressions (1) and (2).

$$Sc=(Sb+Sa)/(2\cos\alpha) \tag{1}$$

$$Sd=(Sb-Sa)/(2\sin\alpha) \tag{2}$$

The first detection value Sv may be the value Sc itself, or may be a result of a predetermined correction, such as a gain adjustment or an offset adjustment, made to the value Sc. In the same manner, the second detection value Sz may be the value Sd itself, or may be a result of a predetermined correction, such as a gain adjustment or an offset adjustment, made to the value Sd.

Next, features of the structure of the magnetic sensor 1 according to the example embodiment will be described. Herein, a combination of the MR element 50 and the lower electrode 61 is referred to as an MR element structure, and is represented by the reference numeral 70. The MR element structure 70 includes the lower electrode 61 and the MR element 50 disposed on the lower electrode 61. The MR element 50 includes the magnetization pinned layer 51 and the free layer 53. The MR element structure 70 is configured such that a current flows in the stacking direction of the lower electrode 61 and the MR element 50.

Figure 8:
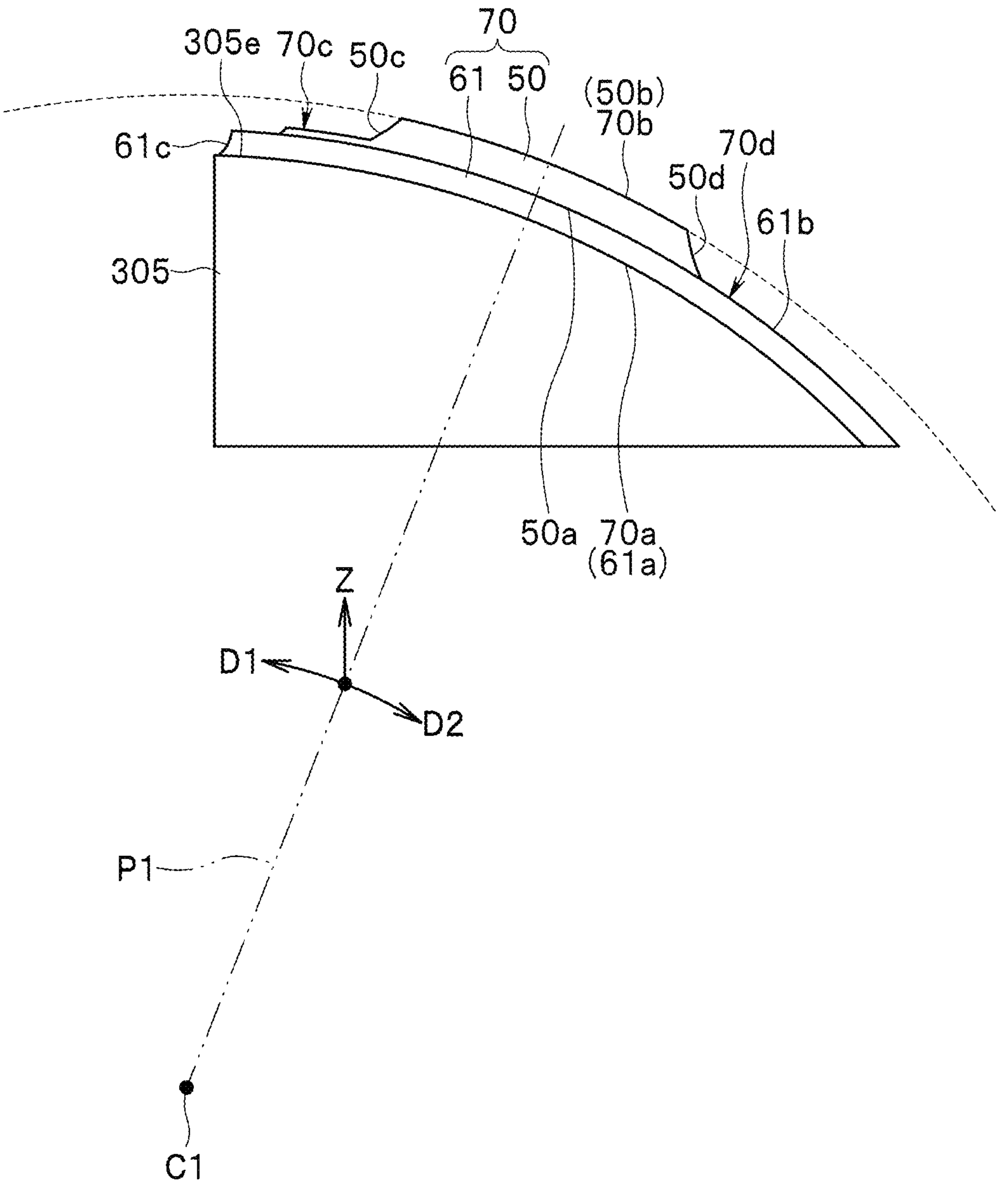
FIG. 8 is a sectional view showing an MR element structure of a first example of the first example embodiment of the technology.
Figure 9:
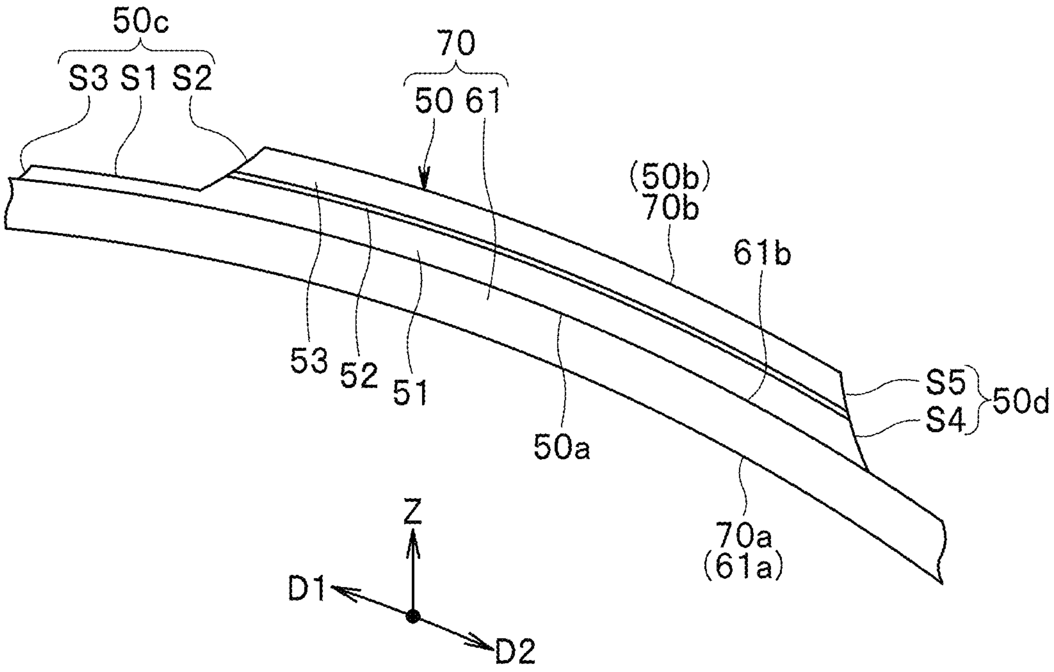
FIG. 9 is a sectional view showing a magnetoresistive element and a lower electrode of the MR element structure shown in FIG. 8.

First, the MR element structure 70 of a first example will be described. FIG. 8 is a sectional view showing the MR element structure 70 of the first example. FIG. 9 is a sectional view showing the MR element 50 and the lower electrode 61 of the MR element structure 70 shown in FIG. 8.

FIG. 8 shows a cross section crossing the MR element 50 disposed on a given inclined surface 305*e* and parallel to a VZ plane. Hereinafter, a cross section parallel to the VZ plane will be referred to as a VZ cross section. The VZ cross section shown in FIG. 8 may be the one in which a cross section of the MR element 50 is seen from a position located forward in the U direction as in FIG. 6. In such a case, the MR element 50, the lower electrode 61, and the inclined surface 305*e* respectively correspond to the first MR element 50B, the lower electrode 61B, and the first inclined surface 305*a*. Alternatively, the VZ cross section shown in FIG. 8 may be the one in which a cross section of the MR element 50 is seen from a position located forward in the –U direction. In such a case, the MR element 50, the lower electrode 61, and the inclined surface 305*e* respectively correspond to the second MR element 50C, the lower electrode 61C, and the second inclined surface 305*b*.

Herein, as shown in FIGS. 8 and 9, a first direction D1 and a second direction D2 parallel to the VZ plane are defined. The first direction D1 is a direction lying along the inclined surface 305*e* and is also a direction away from a reference plane. In the present example embodiment, it is assumed that the top surface 301*a* of the substrate 301 (see FIG. 6) is the reference plane. The Z direction is one direction perpendicular to the reference plane (the top surface 301*a* of the substrate 301). The second direction D2 is a direction lying along the inclined surface 305*e* and is also a direction closer to the reference plane (the top surface 301*a* of the substrate 301).

In the following description, a direction that lies along the inclined surface 305*e* and is parallel to the first direction D1 (a direction parallel to the second direction D2) will be simply referred to as a direction along the inclined surface 305*e*. Such a direction is also a direction that lies along the inclined surface 305*e* and in which a distance from the reference plane (the top surface 301*a* of the substrate 301) changes.

The MR element 50 includes a bottom surface 50*a* facing the inclined surface 305*e*, a top surface 50*b* on the side opposite to the bottom surface 50*a*, a first side surface 50*c*, and a second side surface 50*d*. The first side surface 50*c* connects an end portion of the bottom surface 50*a* on the side of the first direction D1 and an end portion of the top surface 50*b* on the side of the first direction D1. The second side surface 50*d* is disposed forward of the first side surface 50*c* in the second direction D2. The second side surface 50*d* connects an end portion of the bottom surface 50*a* on the side of the second direction D2 and an end portion of the top surface 50*b* on the side of the second direction D2.

In FIG. 8, the reference sign P1 denotes a virtual plane crossing the MR element 50 and perpendicular to the inclined surface 305*e*. In particular, in the present example embodiment, the top surface 50*b* of the MR element 50 is curved. When the top surface 50*b* of the MR element 50 shown in FIG. 8 is regarded as a part of a cylindrical surface, the virtual plane P1 includes a central axis C1 of the cylindrical surface, and also crosses the MR element 50. The virtual plane P1 crosses the center of the top surface 50*b* in the direction along the inclined surface 305*e*.

As shown in FIG. 8, a part of the first side surface 50*c* is inclined such that a distance between a part of the first side surface 50*c* and the virtual plane P1 becomes greater at positions closer to the lower electrode 61. Similarly, the second side surface 50*d* is inclined such that a distance between the second side surface 50*d* and the virtual plane P1 becomes greater at positions closer to the lower electrode 61. A distance between the first side surface 50*c* and the second side surface 50*d* becomes greater at positions closer to the lower electrode 61.

The shape of the second side surface 50*d* of the MR element 50 in a given cross section parallel to the VZ plane is different from the shape of the first side surface 50*c* of the MR element 50. Specifically, the shape of the second side surface 50*d* is asymmetrical to the shape of the first side surface 50*c* about the virtual plane P1 as the center. The distance between the first side surface 50*c* and the virtual plane P1 in a given cross section parallel to the inclined surface 305*e* is greater than the distance between the second side surface 50*d* and the virtual plane P1 in a portion near the top surface 61*b* of the lower electrode 61. In portions other than the portion near the top surface 61*b* of the lower electrode 61, the distance between the first side surface 50*c* and the virtual plane P1 may be equal to the distance between the second side surface 50*d* and the virtual plane P1.

As shown in FIG. 9, the first side surface 50*c* includes a first portion S1 and a second portion S2 having different angles with respect to the inclined surface 305*e*. In particular, in the first example, the angle that the first portion S1 forms with respect to the inclined surface 305*e* is 0 or almost 0. The first portion S1 extends along the top surface 61*b* of the lower electrode 61.

The second portion S2 is disposed at a position farther from the inclined surface 305*e* than a position where the first portion S1 is disposed. The angle that the second portion S2 forms with respect to the inclined surface 305*e* is larger than the angle that the first portion S1 forms with respect to the inclined surface 305*e*. The angle that the second portion S2 forms with respect to the direction parallel to the Z direction is smaller than the angle that the first portion S1 forms with respect to the direction parallel to the Z direction. The second portion S2 is inclined such that the distance between the second portion S2 and the virtual plane P1 (see FIG. 8) becomes greater at positions closer to the lower electrode 61. The distance between the second portion S2 and the virtual plane P1 is less than or equal to the minimum distance between the first portion S1 and the virtual plane P1.

In the example shown in FIG. 9, each of the first portion S1 and the second portion S2 is a curved surface. The angle that the first portion S1 forms with respect to the inclined surface 305*e* may be an angle formed by a first tangent and a second tangent each parallel to the VZ plane. The first tangent is a tangent in contact with a given first point on the first portion S1. The second tangent is a tangent in contact with the inclined surface 305*e* near the first point. Note that in a case where the first tangent and the second tangent are parallel to each other, the angle that the first portion S1 forms with respect to the inclined surface 305*e* is 0. The angle that the second portion S2 forms with respect to the inclined surface 305*e* may also be defined in a similar manner to the angle that the first portion S1 forms with respect to the inclined surface 305*e*. Note that each of the first portion S1 and the second portion S2 is not limited to a curved surface, and may also be a flat surface.

As described above, the MR element 50 includes the magnetization pinned layer 51 as a first magnetic layer and the free layer 53 as a second magnetic layer. In particular, in the present example embodiment, the magnetization pinned layer 51 is provided between the inclined surface 305*e* and the free layer 53. At least a part of the first portion S1 is constituted by a side surface of the magnetization pinned layer 51. At least a part of the second portion S2 is constituted by a side surface of the free layer 53. In particular, in the first example, the second portion S2 is constituted by a side surface of the magnetization pinned layer 51 in addition to the side surface of the free layer 53. In other words, the second portion S2 is formed across a region from the magnetization pinned layer 51 to the free layer 53.

The first side surface 50*c* further includes a third portion S3. The third portion S3 is disposed at a position closer to the inclined surface 305*e* than a position where the first portion S1 is disposed. The third portion S3 is disposed forward of the first portion S1 in the first direction D1.

As shown in FIG. 9, the second side surface 50*d* includes a fourth portion S4 and a fifth portion S5 having different angles with respect to the inclined surface 305*e*. The fifth portion S5 is disposed at a position farther from the inclined surface 305*e* than a position where the fourth portion S4 is disposed. The angle that the fifth portion S5 forms with respect to the inclined surface 305*e* is larger than the angle that the fourth portion S4 forms with respect to the inclined surface 305*e*. The angle that the fifth portion S5 forms with respect to the direction parallel to the Z direction is smaller than the angle that the fourth portion S4 forms with respect to the direction parallel to the Z direction.

The fourth portion S4 is inclined such that the distance between the fourth portion S4 and the virtual plane P1 (see FIG. 8) becomes greater at positions closer to the lower electrode 61. Similarly, the fifth portion S5 is inclined such that the distance between the fifth portion S5 and the virtual plane P1 (see FIG. 8) becomes greater at positions closer to the lower electrode 61. The distance between the fifth portion S5 and the virtual plane P1 is less than or equal to the minimum distance between the fourth portion S4 and the virtual plane P1.

In the example shown in FIG. 9, each of the fourth portion S4 and the fifth portion S5 is a curved surface. However, each of the fourth portion S4 and the fifth portion S5 may also be a flat surface.

At least a part of the fourth portion S4 is constituted by a side surface of the magnetization pinned layer 51. At least a part of the fifth portion S5 is constituted by a side surface of the free layer 53. The entire fourth portion S4 may be constituted by the side surface of the magnetization pinned layer 51, and the entire fifth portion S5 may be constituted by the side surface of the free layer 53. Alternatively, a part of each of the fourth portion S4 and the fifth portion S5 may be constituted by a side surface of the gap layer 52. In such a case, a boundary between the first portion S1 and the second portion S2 may be present on the side surface of the gap layer 52.

As shown in FIG. 8, the lower electrode 61 includes a bottom surface 61*a* facing the inclined surface 305*e*, a top surface 61*b* on the side opposite to the bottom surface 61*a*, a third side surface 61*c*, and a fourth side surface 61*d*. The third side surface 61*c* connects an end portion of the bottom surface 61*a* on the side of the first direction D1 and an end portion of the top surface 61*b* on the side of the first direction D1.

Figure 10:
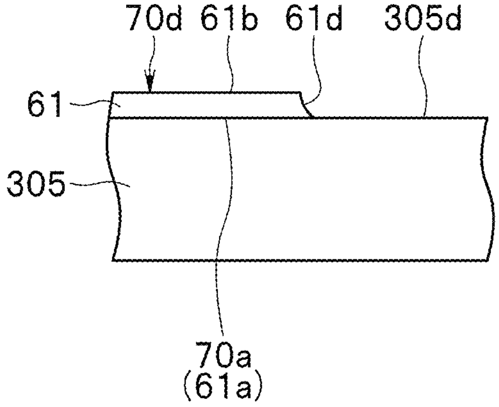
FIG. 10 is a sectional view showing a first example of a fourth side surface of the lower electrode of the first example embodiment of the technology.

The fourth side surface 61*d* is disposed on the side of a direction away from the third side surface 61*c* along a top surface of the insulating layer 305. Hereinafter, a first example and a second example of the fourth side surface 61*d* will be described. First, the first example of the fourth side surface 61*d* will be described with reference to FIG. 10. FIG. 10 is a sectional view showing the first example of the fourth side surface 61*d*. In the first example, the lower electrode 61 is formed on a region from the inclined surface 305*e* to the flat surface 305*d*. The fourth side surface 61*d* connects, on the flat surface 305*d*, an end portion of the bottom surface 61*a* and an end portion of the top surface 61*b* located above the flat surface 305*d*.

Figure 11:
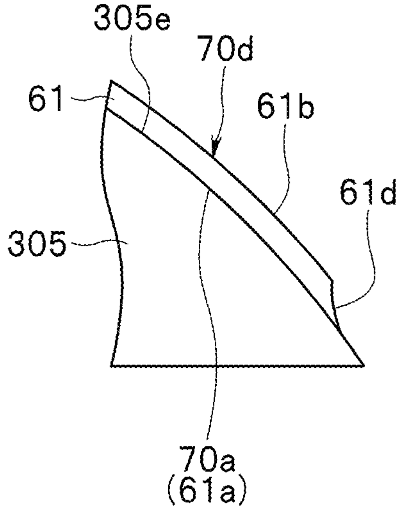
FIG. 11 is a sectional view showing a second example of a fourth side surface of the lower electrode of the first example embodiment of the technology.

Next, the second example of the fourth side surface 61*d* will be described with reference to FIG. 11. FIG. 11 is a sectional view showing the second example of the fourth side surface 61*d*. In the second example, the entire lower electrode 61 is disposed on the inclined surface 305*e*. The fourth side surface 61*d* is located on the inclined surface 305*e*. The fourth side surface 61*d* connects an end portion of the bottom surface 61*a* on the side of the second direction D2 and an end portion of the top surface 61*b* on the side of the second direction D2.

Note that FIG. 6 shows the lower electrodes 61 each including the fourth side surface 61*d* shown in FIG. 11. However, the lower electrodes 61 in FIG. 6 may each include the fourth side surface 61*d* shown in FIG. 10.

The MR element structure 70 includes a bottom surface 70*a* facing the inclined surface 305*e*, and a top surface 70*b* on the side opposite to the bottom surface 70*a*. The bottom surface 70*a* of the MR element structure 70 is constituted by the bottom surface 61*a* of the lower electrode 61. The top surface 70*b* of the MR element structure 70 is constituted by the top surface 50*b* of the MR element 50.

The MR element structure 70 further includes a first surface 70*c* connecting the bottom surface 70*a* and the top surface 70*b*. The first surface 70*c* is constituted by the first side surface 50*c* of the MR element 50, the third side surface 61*c* of the lower electrode 61, and a part of the top surface 61*b* of the lower electrode 61 not covered with the MR element 50.

The first surface 70*c* includes two steps. In other words, the first surface 70*c* includes a first step present between the first portion S1 and the third portion S3 of the first side surface 50*c*, and a second step present between the third portion S3 of the first side surface 50*c* and the third side surface 61*c* of the lower electrode 61. The first step is present on the MR element 50 of the MR element structure 70. The second step is present between the MR element 50 and the lower electrode 61.

The MR element structure 70 further includes a second surface 70*d* connecting the bottom surface 70*a* and the top surface 70*b* on the side of a direction away from the first surface 70*c* along the top surface of the insulating layer 305. The second surface 70*d* is constituted by the second side surface 50*d* of the MR element 50, the fourth side surface 61*d* of the lower electrode 61, and another part of the top surface 61*b* of the lower electrode 61 not covered with the MR element 50. The second surface 70*d* includes fewer steps than the first surface 70*c*. In other words, the second surface 70*d* includes one step present between the second side surface 50*d* and the fourth side surface 61*d*.

The shape of the second surface 70*d* in a given cross section parallel to the VZ plane is different from the shape of the first surface 70*c*. Specifically, the shape of the second surface 70*d* is asymmetrical to the shape of the first surface 70*c* about the virtual plane P1 as the center.

Figure 12:
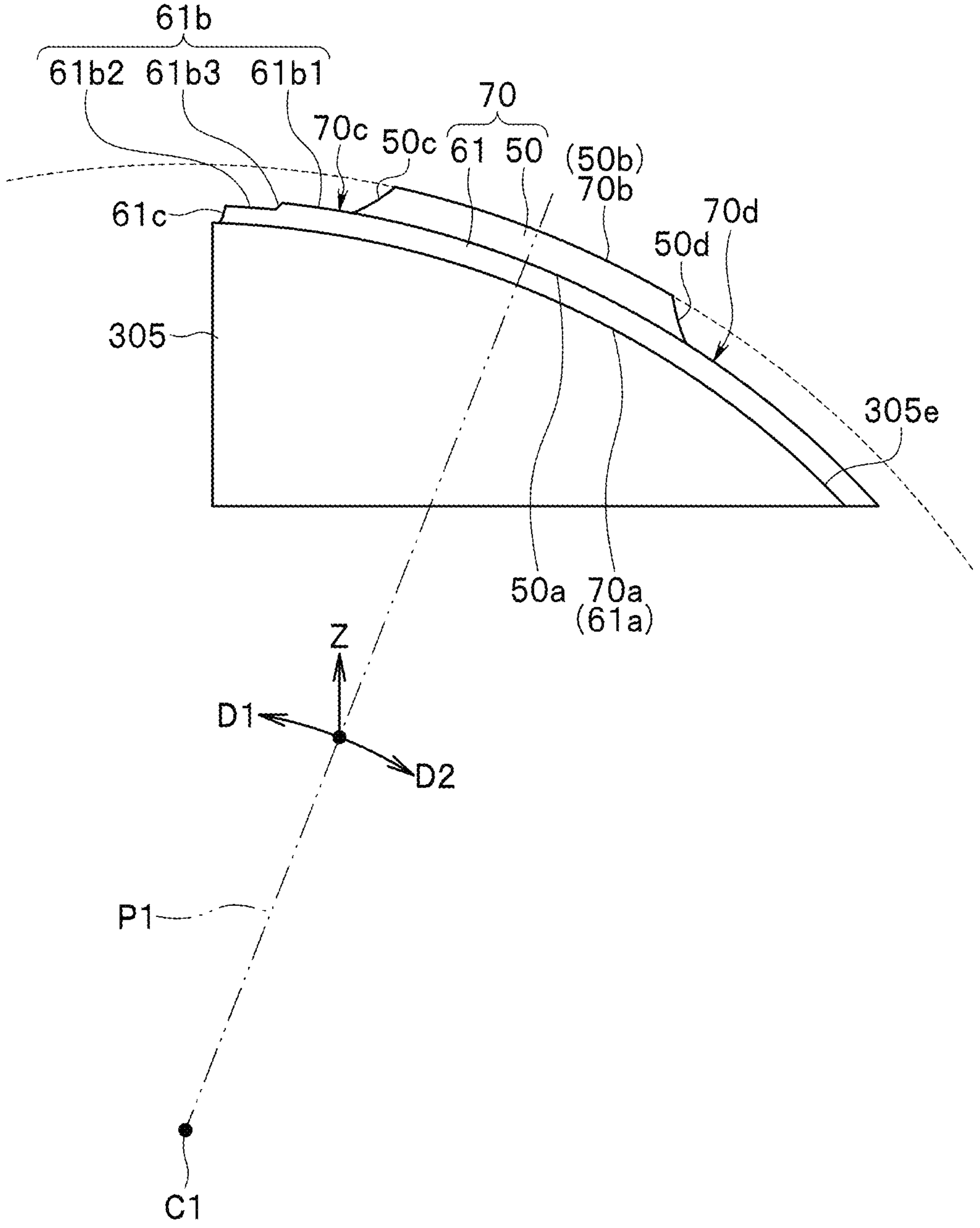
FIG. 12 is a sectional view showing an MR element structure of a second example of the first example embodiment of the technology.

Next, the MR element structure 70 of a second example will be described. FIG. 12 is a sectional view showing the MR element structure 70 of the second example.

In the second example, the shape of the first side surface 50*c* of the MR element 50 is different from the shape in the first example. In the second example, the first side surface 50*c* of the MR element 50 does not include the third portion S3 (see FIG. 9). In the second example, the shapes of the first side surface 50*c* and the second side surface 50*d* of the MR element 50 in a given cross section parallel to the VZ plane are substantially symmetrical or almost symmetrical. Specifically, the shape of the first side surface 50*c* is symmetrical or almost symmetrical to the shape of the second side surface 50*d* about the virtual plane P1 as the center. The distance between the first side surface 50*c* and the virtual plane P1 in a given cross section parallel to the inclined surface 305*e* is equal to or almost equal to the distance between the second side surface 50*d* and the virtual plane P1.

In the second example, the description of the fourth and fifth portions S4 and S5 of the second side surface 50*d* in the first example holds true also for the first and second portions S1 and S2 of the first side surface 50*c* in the second example (see FIG. 9). Replacing the fourth and fifth portions S4 and S5 in the description of the fourth and fifth portions S4 and S5 of the second side surface 50*d* in the first example with the first and second portions S1 and S2, respectively, can provide a description of the first and second portions S1 and S2 of the first side surface 50*c* in the second example.

In the second example, the top surface 61*b* of the lower electrode 61 includes a first portion 61*b*1, a second portion 61*b*2, and a third portion 61*b*3. The MR element 50 is disposed on the first portion 61*b*1. The second portion 61*b*2 is connected to the third side surface 61*c* of the lower electrode 61. Each of the first and second portions 61*b*1 and 61*b*2 extends along the inclined surface 305*e*. The second portion 61*b*2 is located at a position closer to the inclined surface 305*e* than a position where the first portion 61*b*1 is located. The third portion 61*b*3 connects the first portion 61*b*1 and the second portion 61*b*2.

In the second example, the first surface 70*c* of the MR element structure 70 is formed by the first side surface 50*c* of the MR element 50, a part of the first portion 61*b*1 of the top surface 61*b* not covered with the MR element 50, the second and third portions 61*b*2 and 61*b*3 of the top surface 61*b*, and the third side surface 61*c*. The first surface 70*c* includes a first step present between the first side surface 50*c* of the MR element 50 and the third portion 61*b*3 of the top surface 61*b* of the lower electrode 61, and a second step present between the third side surface 61*c* of the lower electrode 61 and the third portion 61*b*3 of the top surface 61*b* of the lower electrode 61. The first step is present between the MR element 50 and the lower electrode 61. The second step is present on the lower electrode 61.

Next, operations and effects of the magnetic sensor 1 according to the example embodiment will be described. In the present example embodiment, the first surface 70*c* of the MR element structure 70 includes the first and second steps. In the first example, the first step is present on the MR element 50 of the MR element structure 70. Provided that the first step is not present, the first side surface 50*c* of the MR element 50 has a smooth profile in a region from the bottom surface 50*a* to the top surface 50*b* of the MR element 50. When comparison is made under the condition that the dimension of the bottom surface 50*a* and the dimension of the top surface 50*b* of the MR element 50 in a direction along the inclined surface 305*e* are the same, a gap between the first side surface 50*c* of the MR element 50 and the upper electrode 62 in the present example embodiment is larger than in the case where the first step is not present. Thereby, according to the present example embodiment, a short between the first side surface 50*c* and the upper electrode 62 can be suppressed.

In the second example, the second step is formed on the lower electrode 61. Thereby, according to the present example embodiment, a gap between the lower electrode 61 and the upper electrode 62 can be increased than in the case where the second step is not present. Thereby, according to the present example embodiment, a short between the lower electrode 61 and the upper electrode 62 can be suppressed.

In the present example embodiment, the magnetization pinned layer 51 is provided between the inclined surface 305*e* and the free layer 53. When comparison is made under the condition that the dimension of the top surface 50*b* of the MR element 50 in the direction along the inclined surface 305*e* is the same, the dimension of the magnetization pinned layer 51 in the direction along the inclined surface 305*e* in the present example embodiment is greater than in the case where the first side surface 50*c* does not include the first portion S1. Thereby, according to the present example embodiment, the volume of the magnetization pinned layer 51 can be increased, and thus, a change in the magnetization direction of the magnetization pinned layer 51 can be suppressed.

In the present example embodiment, the second side surface 50*d* includes the fourth portion S4 and the fifth portion S5 having different angles with respect to the inclined surface 305*e*. In particular, in the present example embodiment, the angle that the fifth portion S5 forms with respect to the inclined surface 305*e* is larger than the angle that the fourth portion S4 forms with respect to the inclined surface 305*e*. In a case where the second side surface 50*d* does not include the fifth portion S5, that is, in a case where the entire second side surface 50*d* is substantially the fourth portion S4, the angle that the second side surface 50*d* forms with respect to the inclined surface 305*e* is small as a whole. In such a case, the second side surface 50*d* has a gentle taper shape. An area in which the upper electrode 62 faces the second side surface 50*d* becomes larger as the taper is gentler.

In contrast, in the present example embodiment, the second side surface 50*d* includes the fifth portion S5 in addition to the fourth portion S4. When comparison is made under the condition that the dimension of the bottom surface 50*a* of the MR element 50 in the direction along the inclined surface 305*e* is the same, an area in which the upper electrode 62 faces the second side surface 50*d* in the present example embodiment is smaller than in the case where the second side surface 50*d* does not include the fifth portion S5. Thereby, according to the present example embodiment, a short between the second side surface 50*d* and the upper electrode 62 can be suppressed.

In the present example embodiment, at least a part of the fourth portion S4 belongs to the magnetization pinned layer 51. At least a part of the fifth portion S5 belongs to the free layer 53. When comparison is made under the condition that the dimension of the top surface 50*b* of the MR element 50 in the direction along the inclined surface 305*e* is the same, the dimension of the free layer 53 in the direction along the inclined surface 305*e* in the present example embodiment is smaller than in the case where the second side surface 50*d* does not include the fifth portion S5. The direction along the inclined surface 305*e* is a direction orthogonal to the longitudinal direction of the MR element 50 (the direction parallel to the U direction), and is the short-side direction of the MR element 50. Thus, according to the present example embodiment, the dimension in the short-side direction of the MR element 50 can be reduced, and thus, a decrease in the shape anisotropy (magnetic shape anisotropy) of the free layer 53 can be suppressed.

The shape anisotropy (magnetic shape anisotropy) of the free layer 53 also changes depending on the angle that a side surface (a part of the second side surface 50*d*) of the free layer 53 forms with respect to the inclined surface 305*e*. In other words, as the foregoing angle is smaller, the shape anisotropy (magnetic shape anisotropy) of the free layer 53 becomes smaller. In the present example embodiment, since the fifth portion S5 is formed on the free layer 53, the foregoing angle is larger than in the case where the fifth portion S5 is not present. Thereby, according to the present example embodiment, a decrease in the shape anisotropy (magnetic shape anisotropy) of the free layer 53 can be suppressed.

In the present example embodiment, when comparison is made under the condition that the dimension of the top surface 50*b* of the MR element 50 in the direction along the inclined surface 305*e* is the same, the dimension of the magnetization pinned layer 51 in the direction along the inclined surface 305*e* is greater than in the case where the second side surface 50*d* does not include the fourth portion S4. Thereby, according to the present example embodiment, the volume of the magnetization pinned layer 51 can be increased, and thus, a change in the magnetization direction of the magnetization pinned layer 51 can be suppressed.

Hereinafter, the MR element structure 70 of a third example will be briefly described. The MR element structure 70 of the third example includes the MR element 50 of the second example and the lower electrode 61 of the first example. In the present example embodiment, a pair of the MR element 50 of the first or second example and the MR element 50 of the third example can be selected as a pair of the first MR element 50B and the second MR element 50C of the present example embodiment. For example, the MR element 50 of the first or second example may be selected as the first MR element 50B, and the MR element 50 of the third example may be selected as the second MR element 50C. In such a case, each of the first and second surfaces 70*c* and 70*d* of the MR element structure 70, which includes the second MR element 50C, includes one step.

Alternatively, the MR element 50 of the first or second example may be selected as each of the first MR element 50B and the second MR element 50C.

MODIFICATION EXAMPLES

Figure 13:
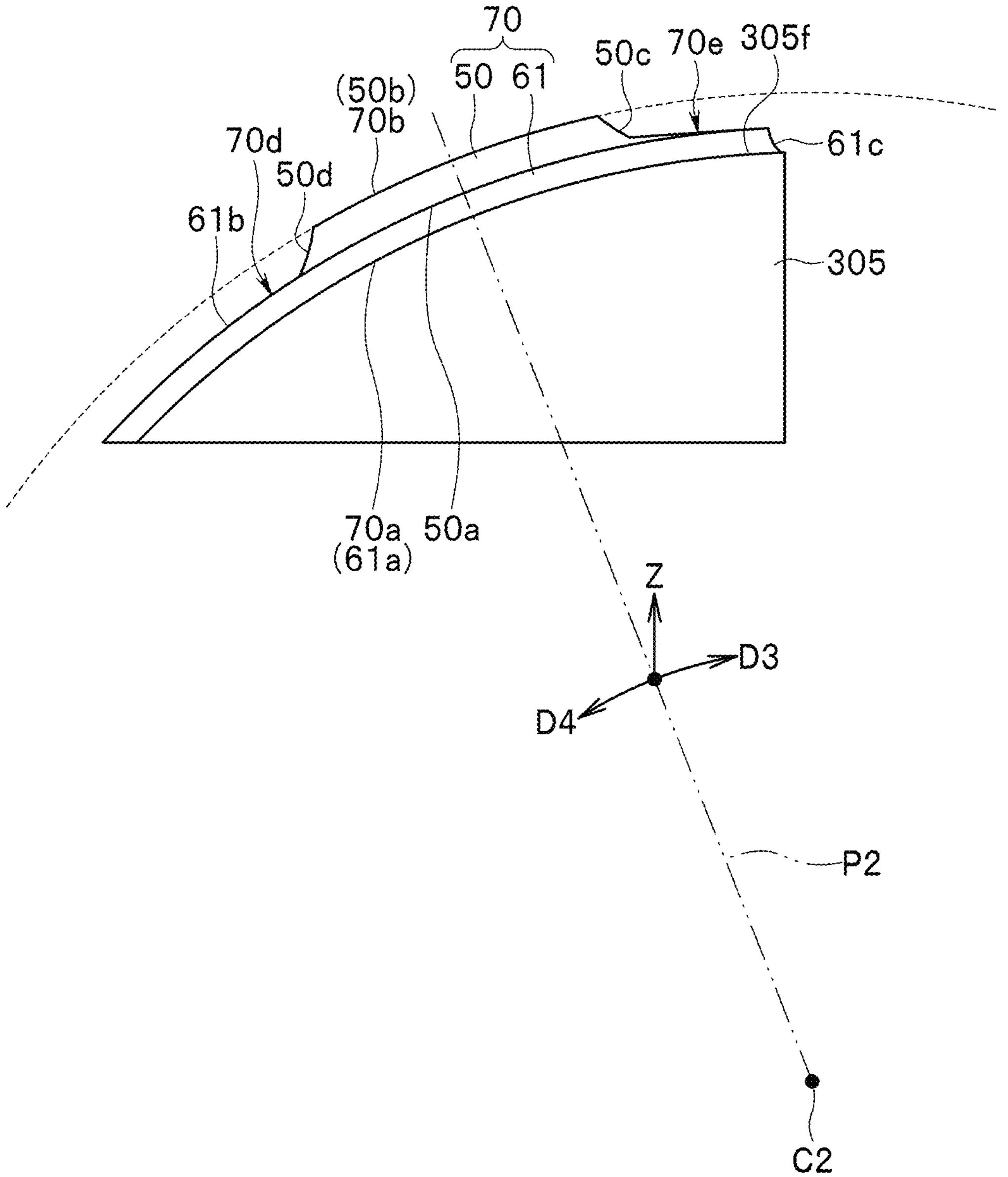
FIG. 13 is a sectional view showing an MR element structure of a first modification example of the magnetic sensor according to the first example embodiment of the technology.
Figure 14:
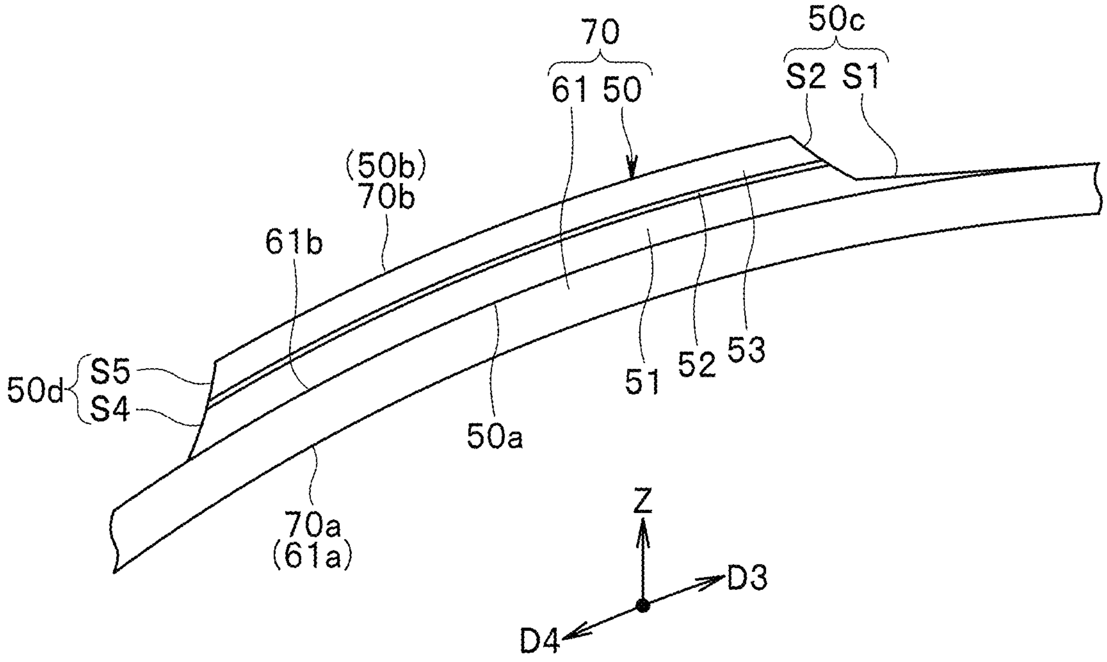
FIG. 14 is a sectional view showing a magnetoresistive element and a lower electrode of the MR element structure shown in FIG. 13.

Next, first and second modification examples of the magnetic sensor 1 according to the present example embodiment will be described. First, the first modification example will be described with reference to FIGS. 13 and 14. FIG. 13 is a sectional view showing an MR element structure of the first modification example. FIG. 14 is a sectional view showing a magnetoresistive element and a lower electrode of the MR element structure shown in FIG. 13.

FIG. 13 shows the VZ cross section crossing the MR element 50 disposed on a given inclined surface 305*f*. The VZ cross section may be the one in which a cross section of the MR element 50 is seen from a position located forward in the U direction as in FIG. 6. In such a case, the MR element 50, the lower electrode 61, and the inclined surface 305*f* respectively correspond to the second MR element 50C, the lower electrode 61C, and the second inclined surface 305*b*. Alternatively, the VZ cross section shown in FIG. 13 may be the one in which a cross section of the MR element 50 is seen from a position located forward in the –U direction. In such a case, the MR element 50, the lower electrode 61, and the inclined surface 305*f* respectively correspond to the first MR element 50B, the lower electrode 61B, and the first inclined surface 305*a*.

Herein, as shown in FIGS. 13 and 14, a third direction D3 and a fourth direction D4 parallel to the VZ plane are defined. The third direction D3 is a direction lying along the inclined surface 305*f* and is also a direction away from the reference plane (the top surface 301*a* of the substrate 301). The fourth direction D4 is a direction lying along the inclined surface 305*f* and is also a direction closer to the reference plane (the top surface 301*a* of the substrate 301).

In the following description, a direction that lies along the inclined surface 305*f* and is parallel to the third direction D3 (a direction parallel to the fourth direction D4) will be simply referred to as a direction along the inclined surface 305*f*. Such a direction is also a direction that lies along the inclined surface 305*f* and in which a distance from the reference plane (the top surface 301*a* of the substrate 301) changes.

In FIG. 13, the reference sign P2 denotes a virtual plane crossing the MR element 50 and perpendicular to the inclined surface 305*f*. When the top surface 50*b* of the MR element 50 shown in FIG. 13 is regarded as a part of a cylindrical surface, the virtual plane P2 includes a central axis C2 of the cylindrical surface, and also crosses the MR element 50. The virtual plane P2 crosses the center of the top surface 50*b* in the direction along the inclined surface 305*f*.

The description of the MR element structure 70 of the first example holds true also for the MR element structure 70 of the first modification example except for a plurality of points described below. Replacing the inclined surface 305*e*, the first direction D1, the second direction D2, and the virtual plane P1 in the description of the MR element structure 70 of the first example with the inclined surface 305*f*, the third direction D3, the fourth direction D4, and the virtual plane P2, respectively, can provide a description of the MR element structure 70 of the first modification example.

In the first modification example, the shape of the first side surface 50*c* of the MR element 50 is different from the shape in the first example. In the first modification example, the first side surface 50*c* does not include the third portion S3.

In the first modification example, the first surface 70*c* of the MR element structure 70 is constituted by the first side surface 50*c* of the MR element 50 and the third side surface 61*c* of the lower electrode 61. The first surface 70*c* includes one step present between the second portion S2 of the first side surface 50*c* and the third side surface 61*c* of the lower electrode 61.

Figure 15:
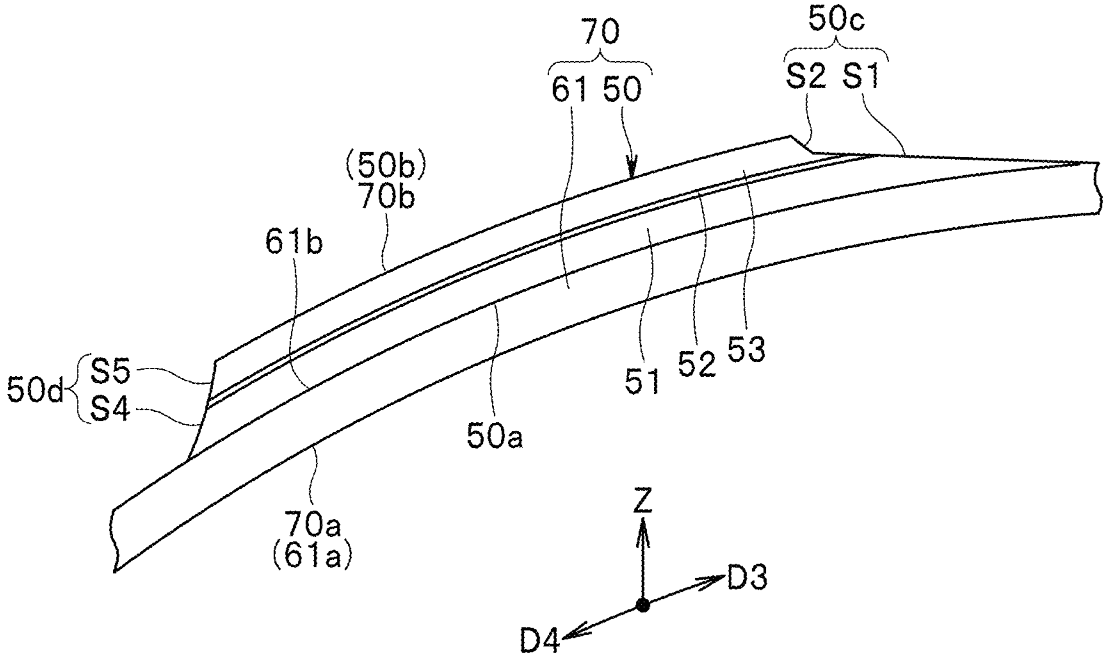
FIG. 15 is a sectional view showing an MR element structure of a second modification example of the magnetic sensor according to the first example embodiment of the technology.

Next, the second modification example will be described with reference to FIG. 15. FIG. 15 is a sectional view showing an MR element structure of the second modification example.

In the second modification example, the shape of the first side surface 50*c* of the MR element 50 is different from the shape in the first modification example. In the second modification example, the first portion S1 of the first side surface 50*c* is constituted by a side surface of the free layer 53 in addition to a side surface of the magnetization pinned layer 51. In other words, the first portion S1 is formed across a region from the magnetization pinned layer 51 to the free layer 53.

Second Example Embodiment

Figure 16:
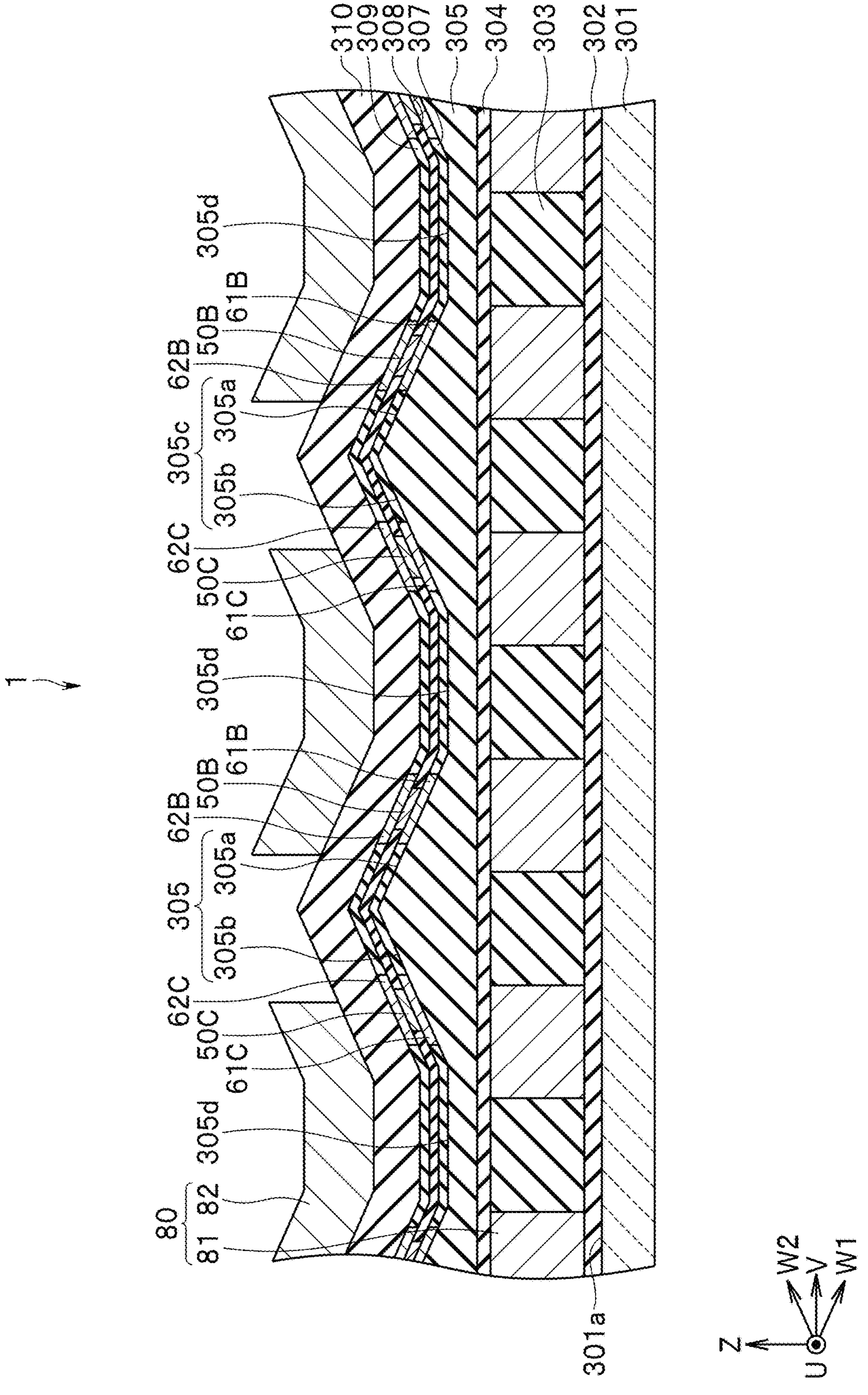
FIG. 16 is a sectional view showing a part of the magnetic sensor according to a second example embodiment of the technology.

A magnetic sensor 1 according to a second example embodiment of the technology will now be described with reference to FIG. 16. FIG. 16 is a sectional view showing a part of the magnetic sensor 1 according to the present example embodiment.

In the present example embodiment, each of the plurality of protruding surfaces 305*c* of the insulating layer 305 has a triangular roof-like overall shape formed by moving the triangular shape of the protruding surface 305*c* shown in FIG. 16 in the direction parallel to the U direction. All the plurality of first inclined surfaces 305*a* and the plurality of second inclined surfaces 305*b* of the insulating layer 305 are flat surfaces. Each of the plurality of first inclined surfaces 305*a* is a flat surface parallel to the U direction and the W1 direction. Each of the plurality of second inclined surfaces 305*b* is a flat surface parallel to the U direction and the W2 direction.

Like the example shown in FIG. 6, the insulating layer 305 may include a plurality of protrusions for forming the plurality of protruding surfaces 305*c*. Alternatively, the insulating layer 305 may include a plurality of slopes arranged in the direction parallel to the V direction. The plurality of slopes each include a first wall surface corresponding to a first inclined surface 305*a* and a second wall surface corresponding to a second inclined surface 305*b*. A protruding surface 305*c* is constituted by the first wall surface of one slope and the second wall surface of another slope adjoining on the −V direction side of the one slope.

In the example shown in FIG. 16, the plurality of slopes each have a bottom surface corresponding to the flat surface 305*d*. However, the plurality of slopes do not need to have a bottom surface each.

The configuration, operation, and effects of the present example embodiment are otherwise the same as those of the first example embodiment.

The technology is not limited to the foregoing example embodiments, and various modifications may be made thereto. For example, the shape of each of the first and second surfaces 70*c* and 70*d* of the MR element structure 70 is not limited to the example shown in each example embodiment, and may be any shape as long as the requirements of the claims are met. The first surface 70*c* may include three or more steps. In such a case, the second surface 70*d* may include fewer steps than the first surface 70*c*.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

As described above, the magnetic sensor according to one embodiment of the technology includes a substrate including a reference plane; a support member disposed on the substrate, the support member including an inclined surface inclined with respect to the reference plane; and a magnetic detection element structure disposed on the inclined surface, the magnetic detection element structure including a bottom surface facing the inclined surface, a top surface on a side opposite to the bottom surface, and a first surface connecting the bottom surface and the top surface and including two steps.

In the magnetic sensor according to one embodiment of the technology, the magnetic detection element structure may further include a second surface connecting the bottom surface and the top surface on a side of a direction away from the first surface along the inclined surface. The second surface may have a shape asymmetrical to a shape of the first surface about a virtual plane as a center, the virtual plane crossing the magnetic detection element structure and being perpendicular to the inclined surface. The second surface may include fewer steps than the first surface.

In the magnetic sensor according to one embodiment of the technology, the magnetic detection element structure may include a lower electrode and a magnetic detection element disposed on the lower electrode, and may be configured such that a current flows in a stacking direction of the lower electrode and the magnetic detection element. The magnetic detection element may include a free layer and a magnetization pinned layer, the free layer having a magnetization whose direction is variable depending on an external magnetic field, the magnetization pinned layer having a magnetization whose direction is fixed, the magnetization pinned layer being provided between the free layer and the inclined surface. One of the two steps may be present on the magnetic detection element, and the other of the two steps may be present between the magnetic detection element and the lower electrode. Alternatively, one of the two steps may be present between the magnetic detection element and the lower electrode, and the other of the two steps may be present on the lower electrode.

In the magnetic sensor according to one embodiment of the technology, the first surface may include a curved surface portion.

In the magnetic sensor according to one embodiment of the technology, the inclined surface may be a curved surface. Alternatively, the inclined surface may be a flat surface.

The magnetic sensor according to one embodiment of the technology may further include an insulating layer and an upper electrode. The magnetic detection element structure may include a lower electrode and a magnetic detection element disposed on the lower electrode. The upper electrode may be disposed at a position where the magnetic detection element is sandwiched between the upper electrode and the lower electrode. The insulating layer may be disposed around the magnetic detection element structure between the lower electrode and the upper electrode.

In the magnetic sensor according to one embodiment of the technology, the support member may include a protruding surface protruding in a direction away from the reference plane. The protruding surface may include the inclined surface and another inclined surface inclined with respect to the reference plane and facing a direction different from a direction of the foregoing inclined surface. In such a case, the magnetic sensor according to one embodiment of the technology may further include another magnetic detection element structure disposed on the other inclined surface and including a bottom surface facing the other inclined surface, a top surface on a side opposite to the bottom surface, and two surfaces each connecting the bottom surface and the top surface. Each of the two surfaces of the other magnetic detection element structure may include fewer steps than the first surface.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:

a support member including an inclined surface inclined with respect to a reference plane; and a magnetic detection element structure including: a bottom surface, at least a part of which faces the inclined surface; a top surface on a side opposite to the bottom surface; and a first surface connecting the bottom surface and the top surface and including a plurality of steps, wherein:

the magnetic detection element structure includes an electrode including the bottom surface, and a magnetic detection element disposed on the electrode and including the top surface;

the electrode includes a first side surface that constitutes a part of the first surface; and the first side surface is inclined with respect to a direction perpendicular to the inclined surface.

2. The magnetic sensor according to claim 1, wherein the magnetic detection element structure further includes a second surface connecting the bottom surface and the top surface on a side of a direction away from the first surface along the inclined surface.

3. The magnetic sensor according to claim 2, wherein the second surface has a shape asymmetrical to a shape of the first surface about a virtual plane as a center, the virtual plane crossing the magnetic detection element structure and being perpendicular to the inclined surface.

4. The magnetic sensor according to claim 3, wherein the second surface includes fewer steps than the first surface.

5. The magnetic sensor according to claim 1, wherein the magnetic detection element structure includes a lower electrode and a magnetic detection element disposed on the lower electrode, and is configured such that a current flows in a stacking direction of the lower electrode and the magnetic detection element.

6. The magnetic sensor according to claim 5, wherein the magnetic detection element includes a free layer and a magnetization pinned layer, the free layer having a magnetization whose direction is variable depending on an external magnetic field, the magnetization pinned layer having a magnetization whose direction is fixed, the magnetization pinned layer being provided between the free layer and the inclined surface.

7. The magnetic sensor according to claim 5, wherein:

one of the plurality of steps is present on the magnetic detection element; and another one of the plurality of steps is present between the magnetic detection element and the lower electrode.

8. The magnetic sensor according to claim 5, wherein:

one of the plurality of steps is present between the magnetic detection element and the lower electrode; and another one of the plurality of steps is present on the lower electrode.

9. The magnetic sensor according to claim 1, wherein the first surface includes a curved surface portion.

10. The magnetic sensor according to claim 1, wherein the inclined surface is a curved surface.

11. The magnetic sensor according to claim 1, wherein the inclined surface is a flat surface.

12. The magnetic sensor according to claim 1, further comprising:

an insulating layer; and an upper electrode, wherein:

the magnetic detection element structure includes a lower electrode and a magnetic detection element disposed on the lower electrode;

the upper electrode is disposed at a position where the magnetic detection element is sandwiched between the upper electrode and the lower electrode; and the insulating layer is disposed around the magnetic detection element structure between the lower electrode and the upper electrode.

13. The magnetic sensor according to claim 1, wherein:

the support member includes a protruding surface protruding in a direction away from the reference plane; and the protruding surface includes the inclined surface and another inclined surface inclined with respect to the reference plane and facing a direction different from a direction of the foregoing inclined surface.

14. The magnetic sensor according to claim 13, further comprising another magnetic detection element structure including a bottom surface, at least a part of which faces the other inclined surface, a top surface on a side opposite to the bottom surface, and two surfaces each connecting the bottom surface and the top surface, wherein each of the two surfaces of the other magnetic detection element structure includes fewer steps than the first surface.

15. The magnetic sensor according to claim 1, wherein the support member includes a protrusion including the inclined surface.

16. The magnetic sensor according to claim 1, wherein the support member includes a slope including two wall surfaces opposite to each other, at least one of the two wall surfaces corresponding to the inclined surface.

17. A magnetic sensor comprising:

a support member including an inclined surface inclined with respect to a reference plane; and a magnetic detection element structure including: a bottom surface, at least a part of which faces the inclined surface; a top surface on a side opposite to the bottom surface; a first surface connecting the bottom surface and the top surface and including one or more steps; and a second surface connecting the bottom surface and the top surface on a side of a direction away from the first surface along the inclined surface, wherein:

the magnetic detection element structure includes an electrode including the bottom surface, and a magnetic detection element electrically connected to the electrode and including the top surface;

the electrode includes a first side surface that constitutes a part of the first surface;

the first side surface is inclined with respect to a direction perpendicular to the inclined surface; and the second surface includes no step or includes fewer steps than the first surface.

18. A magnetic sensor comprising:

a substrate including a reference plane;

a support member disposed on the substrate, the support member including an inclined surface inclined with respect to the reference plane; and a magnetic detection element structure including a bottom surface, at least a part of which faces the inclined surface, a top surface on a side opposite to the bottom surface, and a first surface connecting the bottom surface and the top surface and including two steps, wherein the support member includes a protrusion including the inclined surface, or a slope including two wall surfaces opposite to each other, at least one of the two wall surfaces corresponding to the inclined surface.

* * * * *